US012628405B2

(12) United States Patent
Shimizu

(10) Patent No.: US 12,628,405 B2
(45) Date of Patent: May 12, 2026

(54) SEMICONDUCTOR DEVICE, METHOD FOR MANUFACTURING SEMICONDUCTOR DEVICE, INVERTER CIRCUIT, DRIVE DEVICE, VEHICLE, AND ELEVATOR

(71) Applicant: KABUSHIKI KAISHA TOSHIBA, Tokyo (JP)

(72) Inventor: Tatsuo Shimizu, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 495 days.

(21) Appl. No.: 18/177,324

(22) Filed: Mar. 2, 2023

(65) Prior Publication Data

US 2024/0087897 A1 Mar. 14, 2024

(30) Foreign Application Priority Data

Sep. 12, 2022 (JP) ................................. 2022-144470

(51) Int. Cl.
*H10D 64/00* (2025.01)
*B60R 1/02* (2006.01)
(Continued)

(52) U.S. Cl.
CPC ......... *H10D 64/118* (2025.01); *H10D 12/031* (2025.01); *H10D 30/665* (2025.01);
(Continued)

(58) Field of Classification Search
CPC ............. H01L 21/045; H01L 21/02164; H01L 21/0465; H10D 64/118; H10D 30/665;
(Continued)

(56) References Cited

U.S. PATENT DOCUMENTS

| | | |
|---|---|---|
| 9,646,824 B2 | 5/2017 | Hama et al. |
| 2016/0197150 A1 | 7/2016 | Ariyoshi et al. |
| 2021/0296128 A1 | 9/2021 | Shimizu et al. |
| 2022/0005925 A1 | 1/2022 | Shimizu et al. |

(Continued)

FOREIGN PATENT DOCUMENTS

| | | |
|---|---|---|
| JP | 2008-117878 A | 5/2008 |
| JP | 2011-146580 A | 7/2011 |

(Continued)

OTHER PUBLICATIONS

Journal of Applied Physics: "Infrared reflection spectroscopy of the SiO2-silicon interface"; J. Appl. Phys. 66, 1353-1358 (Aug. 1, 1989), https://doi.org/10.1063/1.344435 (Year: 1989).*

(Continued)

*Primary Examiner* — Zandra V Smith
*Assistant Examiner* — Andre C Stevenson
(74) *Attorney, Agent, or Firm* — Maier & Maier, PLLC

(57) ABSTRACT

A semiconductor device according to an embodiment includes a silicon carbide layer, a silicon oxide layer having a peak frequency of a longitudinal wave optical mode of 1245 $cm^{-1}$ or more at a position 0.5 nm away from the silicon carbide layer, and a region located between the silicon carbide layer and the silicon oxide layer and having a nitrogen concentration of $1 \times 10^{21}$ $cm^{-3}$ or more. The concentration distribution of nitrogen in the silicon carbide layer, the silicon oxide layer, and the region has a peak in the region.

12 Claims, 15 Drawing Sheets

(51) Int. Cl.

| | |
|---|---|
| *B61C 3/00* | (2006.01) |
| *B61C 9/50* | (2006.01) |
| *B66B 11/04* | (2006.01) |
| *H02P 27/06* | (2006.01) |
| *H10D 12/01* | (2025.01) |
| *H10D 30/66* | (2025.01) |
| *H10D 62/832* | (2025.01) |
| *H10P 14/692* | (2026.01) |
| *H10P 30/22* | (2026.01) |

(52) U.S. Cl.
CPC ....... *H10D 30/668* (2025.01); *H10D 62/8325* (2025.01); *H10P 14/69215* (2026.01); *H10P 30/22* (2026.01); *B60R 1/02* (2013.01); *B61C 3/00* (2013.01); *B61C 9/50* (2013.01); *B66B 11/043* (2013.01); *H02P 27/06* (2013.01)

(58) Field of Classification Search
CPC ............. H10D 62/8325; H10D 30/668; H10D 12/031; B61C 9/50; B66B 11/043; H02P 27/06
See application file for complete search history.

(56)      References Cited

U.S. PATENT DOCUMENTS

| | | | | |
|---|---|---|---|---|
| 2022/0069089 A1* | 3/2022 | Kawada | ................ | H01L 21/049 |
| 2023/0009820 A1* | 1/2023 | Yen | .................... | H01L 21/0259 |

FOREIGN PATENT DOCUMENTS

| | | |
|---|---|---|
| JP | 2014190970 A | 10/2014 |
| JP | 2015-060905 A | 3/2015 |
| JP | 2015-142034 A | 8/2015 |
| JP | 2021-153168 A | 9/2021 |
| JP | 2022012282 A | 1/2022 |

OTHER PUBLICATIONS

IP.COM search history (Year: 2026).*
M. Murakami, et al, "Stress Characterization of SiO2 / SiC interface by Scanning Near-Field Optical Raman Microscope", The 65th JSAP Spring Meeting, Conference Abstracts, 2018, 13-112, 18p-D103-19, 2 pages.
Tsuchida et al., "Infrared Analysis of SiO2 Films Grown on the 6H-SiC Surfaces", Applied Surface Science, Elsevier Science B.V., ISBN: 0169-4332/97, 1997, vols. 117-118, pp. 225-229.

* cited by examiner

DISTANCE FROM SILICON CARBIDE LAYER
IN GATE INSULATING LAYER (nm)

FIG.6

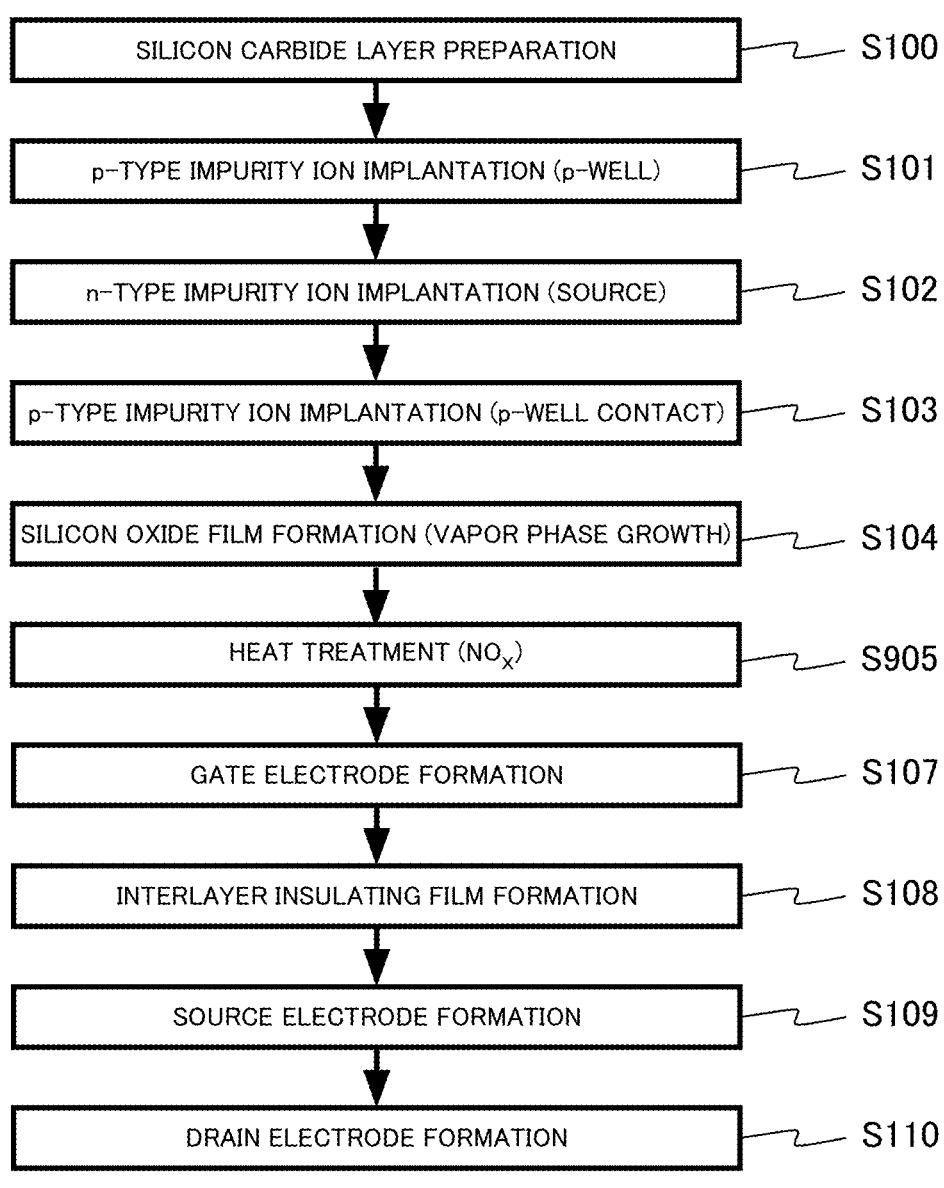

SILICON CARBIDE LAYER PREPARATION — S100 p-TYPE IMPURITY ION IMPLANTATION (p-WELL) — S101 n-TYPE IMPURITY ION IMPLANTATION (SOURCE) — S102 p-TYPE IMPURITY ION IMPLANTATION (p-WELL CONTACT) — S103

SILICON OXIDE FILM FORMATION (VAPOR PHASE GROWTH) — S104

HEAT TREATMENT (NO$_x$) — S905

GATE ELECTRODE FORMATION — S107

INTERLAYER INSULATING FILM FORMATION — S108

SOURCE ELECTRODE FORMATION — S109

DRAIN ELECTRODE FORMATION — S110

800

SEMICONDUCTOR DEVICE, METHOD FOR MANUFACTURING SEMICONDUCTOR DEVICE, INVERTER CIRCUIT, DRIVE DEVICE, VEHICLE, AND ELEVATOR

CROSS-REFERENCE TO RELATED APPLICATION

This application is based upon and claims the benefit of priority from Japanese Patent Application No. 2022-144470, filed on Sep. 12, 2022, the entire contents of which are incorporated herein by reference.

Embodiments described herein relate generally to a semiconductor device, a method for manufacturing a semiconductor device, an inverter circuit, a drive device, a vehicle, and an elevator.

BACKGROUND

Silicon carbide (SiC) is expected as a material for next-generation semiconductor devices. As compared with silicon (Si), silicon carbide has excellent physical properties such as a band gap of three times, a breakdown field strength of about 10 times, and a thermal conductivity of about three times. By utilizing this characteristic, a semiconductor device capable of operating at a low loss and a high temperature can be realized.

For example, when a metal oxide semiconductor field effect transistor (MOSFET) is formed using silicon carbide, there is a problem that carrier mobility decreases.

BRIEF DESCRIPTION OF THE DRAWINGS

FIG. 6 is a process flow diagram of a method for manufacturing a semiconductor device according to a comparative example;

DETAILED DESCRIPTION

Figure 1:
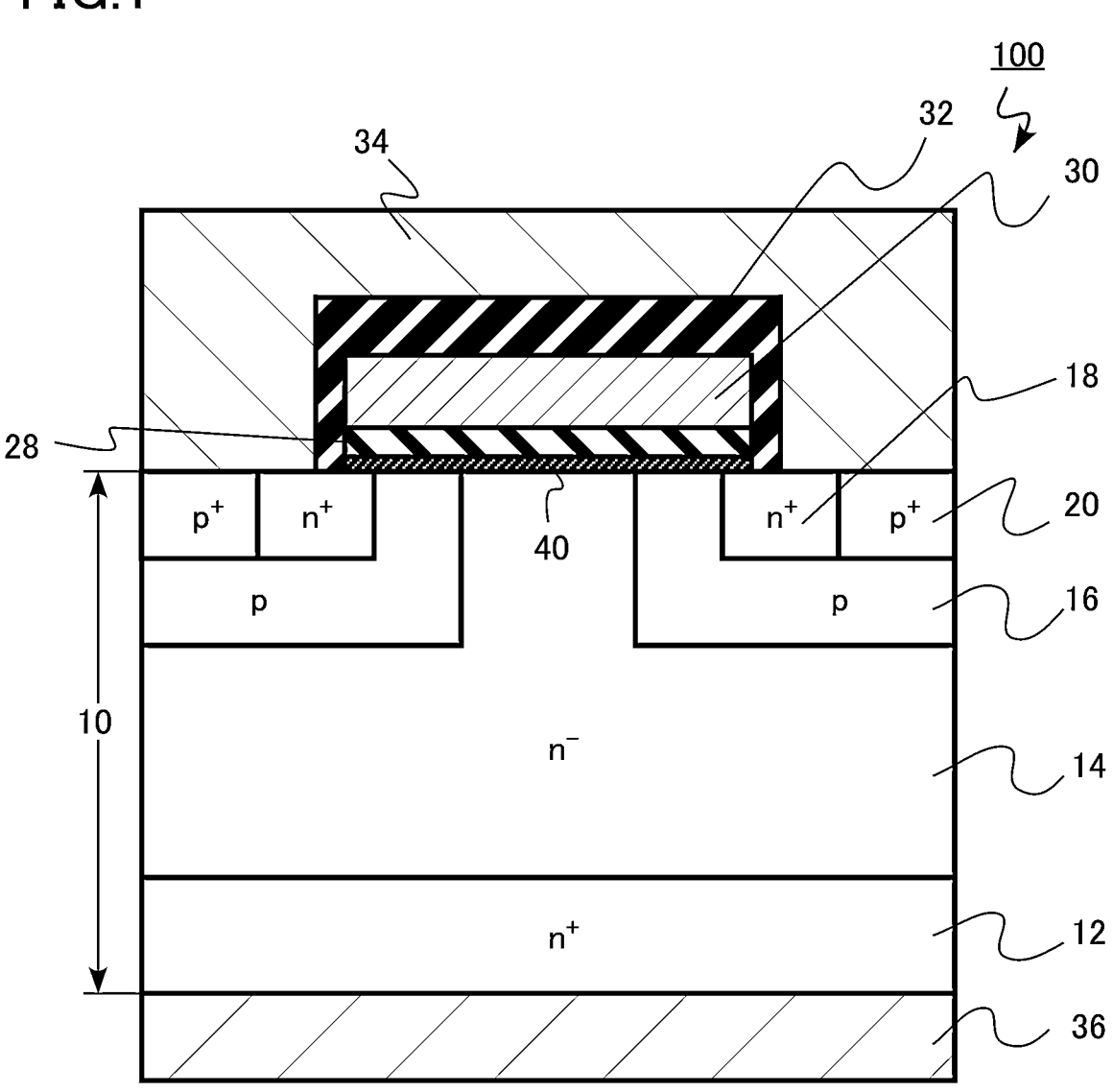
FIG. 1 is a schematic cross-sectional view of a semiconductor device according to a first embodiment.

A semiconductor device according to an embodiment includes: a silicon carbide layer; a silicon oxide layer having a peak frequency of a longitudinal wave optical mode of $1245$ $cm^{-1}$ or more at a position 0.5 nm away from the silicon carbide layer; and a region located between the silicon carbide layer and the silicon oxide layer and having a nitrogen concentration of $1 \times 10^{21}$ $cm^{-3}$ or more, in which a concentration distribution of nitrogen in the silicon carbide layer, the silicon oxide layer, and the region has a peak in the region.

Hereinafter, embodiments of the present disclosure will be described with reference to the drawings. In the following description, the same or similar members and the like are denoted by the same reference numerals, and the description of the members and the like once described is appropriately omitted.

In the following description, when there are notations of $n^+$, n, and $n^-$, and $p^+$, p, and $p^-$, the relative level of the impurity concentration in each conductivity type is represented. That is, $n^+$ indicates that the n-type impurity concentration is relatively higher than n, and $n^-$ indicates that the n-type impurity concentration is relatively lower than n. In addition, $p^+$ indicates that the p-type impurity concentration is relatively higher than p, and $p^-$ indicates that the p-type impurity concentration is relatively lower than p. In addition, an $n^+$-type and an $n^-$-type may be simply referred to as an n-type, and a $p^+$-type and a $p^-$-type may be simply referred to as a p-type. Unless otherwise specified, the impurity concentration of each region is represented by, for example, the value of the impurity concentration in the central portion of each region.

The impurity concentration can be measured by, for example, secondary ion mass spectrometry (SIMS). The relative level of the impurity concentration can also be determined from the level of the carrier concentration obtained by, for example, scanning capacitance microscopy (SCM). The distance such as the width and depth of the impurity region can be obtained by, for example, SIMS. Also, the distance such as the width and depth of the impurity region can be obtained from, for example, the SCM image.

The depth of the trench, the thickness of the insulating layer, and the like can be measured on, for example, a SIMS or transmission electron microscope (TEM) image.

The bonding state of a silicon atom, a carbon atom, a nitrogen atom, and an oxygen atom in the silicon carbide layer can be identified by using, for example, X-ray photo-electron spectroscopy (XPS method). The concentrations of various bonding states and the magnitude relationship of the concentrations can be determined by using, for example, X-ray photoelectron spectroscopy (XPS method).

The peak frequency of the longitudinal wave optical mode in the silicon oxide layer can be measured by, for example, attenuated total reflection (ATR) of Fourier transform infrared spectroscopy (FTIR).

First Embodiment

A semiconductor device according to a first embodiment includes a silicon carbide layer, a silicon oxide layer having a peak frequency of a longitudinal wave optical mode of $1245$ cm$^{-1}$ or more at a position $0.5$ nm away from the silicon carbide layer, and a region located between the silicon carbide layer and the silicon oxide layer and having a nitrogen concentration of $1\times10^{21}$ cm$^{-3}$ or more. The concentration distribution of nitrogen in the silicon carbide layer, the silicon oxide layer, and the region has a peak in the region.

FIG. 1 is a schematic cross-sectional view of a semiconductor device according to a first embodiment. The semiconductor device is a MOSFET 100. The MOSFET 100 is a double implantation MOSFET (DIMOSFET) in which a p-well and a source region are formed by ion implantation. The MOSFET 100 is an n-channel MOSFET using electrons as carriers.

The MOSFET 100 includes a silicon carbide layer 10, a gate insulating layer 28 (silicon oxide layer), a gate electrode 30, an interlayer insulating film 32, a source electrode 34, a drain electrode 36, and an interface termination region 40 (region).

The silicon carbide layer 10 includes a drain region 12, a drift region 14, a p-well region 16, a source region 18, and a p-well contact region 20.

The silicon carbide layer 10 is, for example, a single crystal of 4H-SiC. The silicon carbide layer 10 is located between the source electrode 34 and the drain electrode 36.

Figure 2:
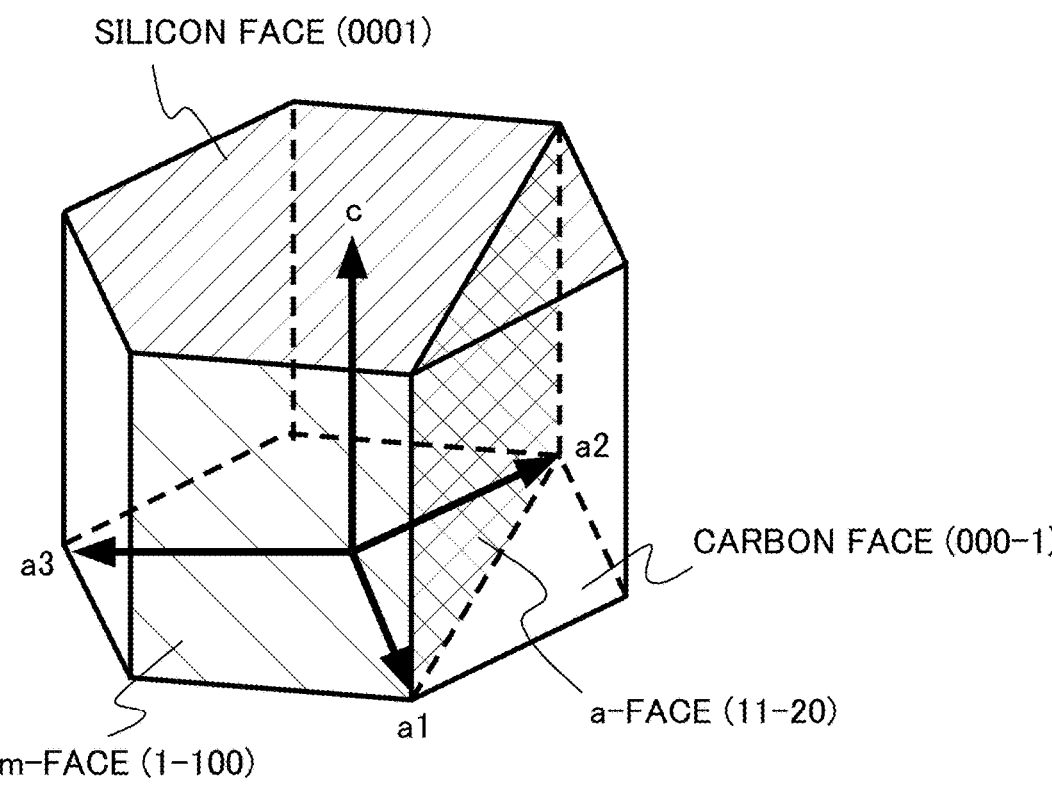
FIG. 2 is a diagram illustrating a crystal structure of a SiC semiconductor.

FIG. 2 is a diagram illustrating a crystal structure of a SiC semiconductor. A typical crystal structure of the SiC semiconductor is a hexagonal crystal system such as 4H-SiC. One of faces having a c-axis along the axial direction of the hexagonal prism as a normal line (top face of the hexagonal prism) is a (0001) face. A face equivalent to the (0001) face is referred to as a silicon face (Si face) and denoted as a {0001} face. Silicon atoms (Si) are arranged on the outermost surface of the silicon face.

The other of faces having a c-axis along the axial direction of the hexagonal prism as a normal line (top face of the hexagonal prism) is a (000-1) face. A face equivalent to the (000-1) face is referred to as a carbon face (C face) and denoted as a {000-1} face. Carbon atoms (C) are arranged on the outermost surface of the carbon face.

Meanwhile, a side surface (columnar face) of the hexagonal prism is an m-face which is a face equivalent to a (1-100) face, that is, a {1-100} face. In addition, a face passing through a pair of ridgelines not adjacent to each other is an a-face which is a face equivalent to a (11-20) face, that is, a {11-20} face. Both silicon atoms (Si) and carbon atoms (C) are arranged on the outermost surfaces of the m-face and the a-face.

Hereinafter, a case where the front surface of the silicon carbide layer 10 is a face inclined at $0°$ or more and $8°$ or less with respect to the silicon face, and the back surface is a face inclined at $0°$ or more and $8°$ or less with respect to the carbon face will be described as an example. The front surface of the silicon carbide layer 10 has an off angle of $0°$ or more and $8°$ or less with respect to the silicon face.

The drain region 12 is n$^+$-type SiC. The drain region 12 contains, for example, nitrogen (N) as n-type impurities. The n-type impurity concentration of the drain region 12 is, for example, $1\times10^{18}$ cm$^{-3}$ or more and $1\times10^{21}$ cm$^{-3}$ or less.

The drift region 14 is provided on the drain region 12. The drift region 14 is n$^-$-type SiC. The drift region 14 contains, for example, nitrogen as n-type impurities.

The n-type impurity concentration of the drift region 14 is lower than the n-type impurity concentration of the drain region 12. The n-type impurity concentration of the drift region 14 is, for example, $1\times10^{15}$ cm$^{-3}$ or more and $2\times10^{16}$ cm$^{-3}$ or less. The drift region 14 is, for example, an epitaxial growth layer of SiC formed by epitaxial growth on the drain region 12.

The thickness of the drift region 14 is, for example, $5$ μm or more and $100$ μm or less.

The p-well region 16 is provided on a surface of a part of the drift region 14. The p-well region 16 is p-type SiC. The p-well region 16 contains, for example, aluminum (Al) as p-type impurities. The p-type impurity concentration of the p-well region 16 is, for example, $1\times10^{16}$ cm$^{-3}$ or more and $1\times10^{20}$ cm$^{-3}$ or less.

The depth of the p-well region 16 is, for example, $0.4$ μm or more and $0.8$ μm or less. The p-well region 16 functions as a channel region of the MOSFET 100.

The source region 18 is provided on a partial surface of the p-well region 16. The source region 18 is n$^+$-type SiC. The source region 18 contains, for example, phosphorus (P) as n-type impurities. The n-type impurity concentration of the source region 18 is, for example, $1\times10^{8}$ cm$^{-3}$ or more and $1\times10^{22}$ cm$^{-3}$ cm or less.

The depth of the source region 18 is shallower than the depth of the p-well region 16. The depth of the source region 18 is, for example, $0.2$ μm or more and $0.4$ μm or less.

The p-well contact region 20 is provided on a partial surface of the p-well region 16. The p-well contact region 20 is provided on the side of the source region 18. The p-well contact region 20 is p$^+$-type SiC.

The p-well contact region 20 contains, for example, aluminum as p-type impurities. The p-type impurity concentration of the p-well contact region 20 is, for example, $1\times10^{8}$ cm$^{-3}$ or more and $1\times10^{22}$ cm$^{-3}$ or less.

The depth of the p-well contact region 20 is shallower than the depth of the p-well region 16. The depth of the p-well contact region 20 is, for example, $0.2$ μm or more and $0.4$ μm or less.

The gate insulating layer 28 is provided between the silicon carbide layer 10 and the gate electrode 30. The gate insulating layer 28 is provided between the drift region 14 and the p-well region 16, and the gate electrode 30. The gate insulating layer 28 is provided on the drift region 14 and the p-well region 16. The gate insulating layer 28 is continuously formed on the surfaces of the drift region 14 and the p-well region 16.

The gate insulating layer 28 is silicon oxide. The gate insulating layer 28 is an example of a silicon oxide layer.

The thickness of the gate insulating layer 28 is, for example, $30$ nm or more and $100$ nm or less. The gate insulating layer 28 functions as a gate insulating layer of the MOSFET 100.

Figure 3:
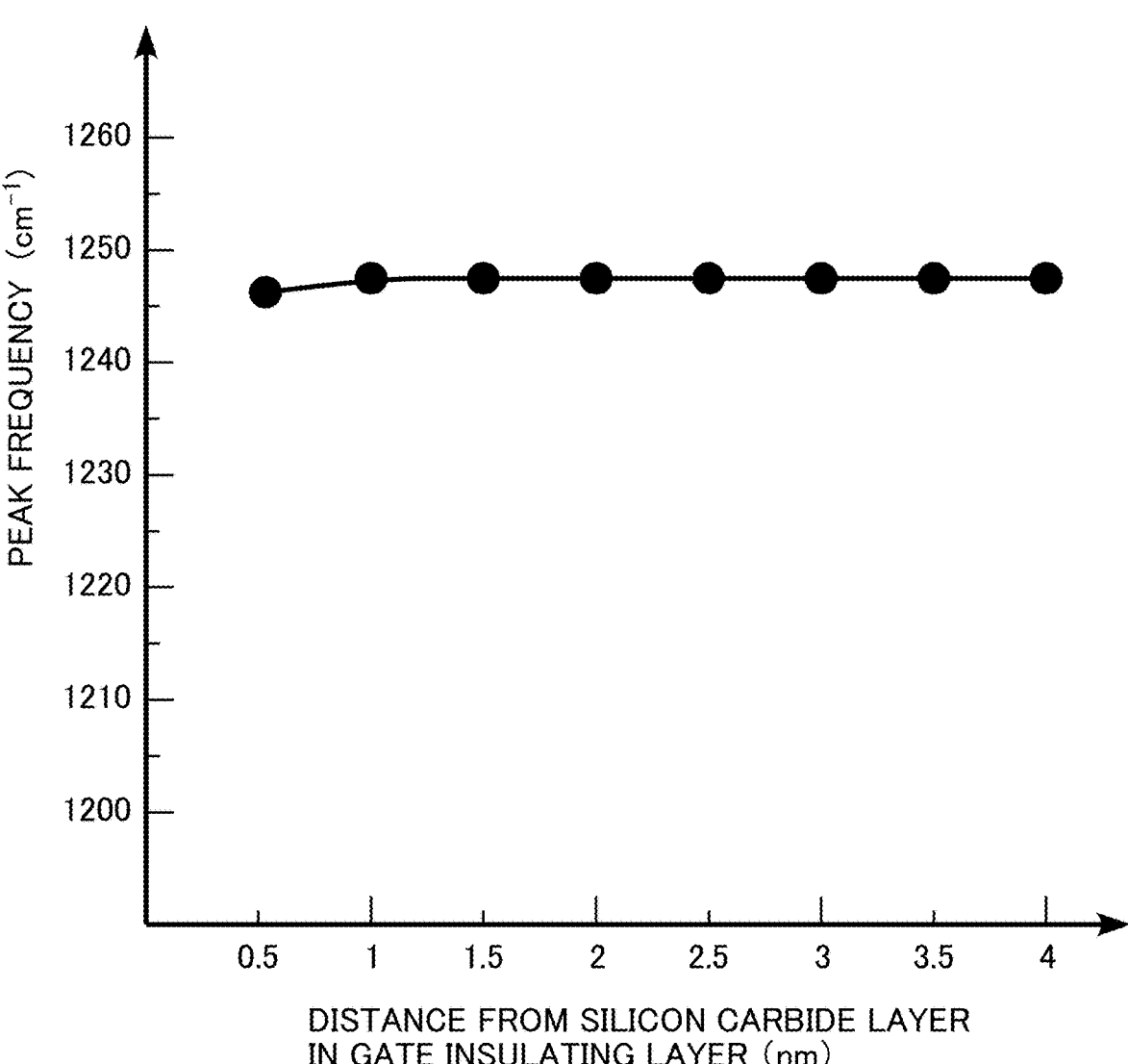
FIG. 3 is a diagram illustrating a peak frequency of a longitudinal wave optical mode in a gate insulating layer of the semiconductor device according to the first embodiment.

FIG. 3 is a diagram illustrating a peak frequency of a longitudinal wave optical mode in the gate insulating layer of the semiconductor device according to the first embodiment.

As illustrated in FIG. 3, the peak frequency of the longitudinal wave optical mode at a position $0.5$ nm away from the silicon carbide layer in the gate insulating layer 28 is $1245$ cm$^{-1}$ or more. The peak frequency of the longitudinal wave optical mode at an arbitrary position of the gate insulating layer 28 away from the silicon carbide layer by $0.5$ nm or more is $1245$ cm$^{-1}$ or more.

The interface termination region 40 is located between the silicon carbide layer 10 and the gate insulating layer 28. The interface termination region 40 includes an interface between the silicon carbide layer 10 and the gate insulating layer 28. The interface termination region 40 is located between the drift region 14 and the p-well region 16, and the gate insulating layer 28.

The interface termination region 40 includes an interface between the silicon carbide layer 10 and the gate insulating layer 28. The interface termination region 40 is, for example, a region having a thickness of about two atomic layers to three atomic layers in the vicinity of the interface between the silicon carbide layer 10 and the gate insulating layer 28.

The interface termination region 40 contains nitrogen (N) as a termination element that terminates the dangling bond of the silicon carbide layer 10. The interface termination region 40 is an example of a region.

The concentration of nitrogen in the interface termination region 40 is $1\times10^{21}$ cm$^{-3}$ or more. The concentration of nitrogen in the interface termination region 40 is, for example, $1\times10^{23}$ cm$^{-3}$ or less.

Figure 4:
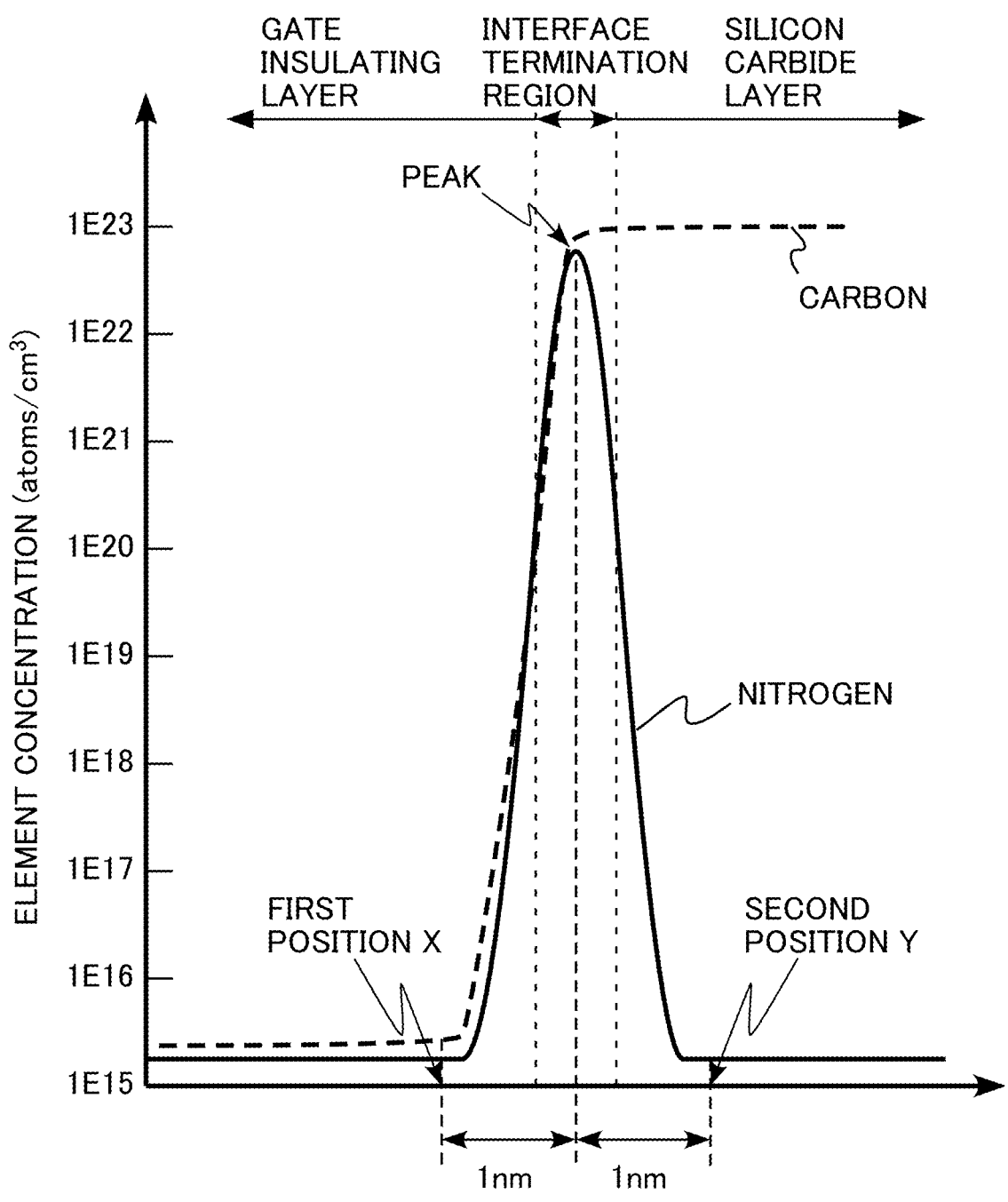
FIG. 4 is a diagram illustrating an element concentration distribution of the semiconductor device according to the first embodiment.

FIG. 4 is a diagram illustrating an element concentration distribution of the semiconductor device according to the first embodiment. FIG. 4 is a diagram illustrating an element concentration distribution in the gate insulating layer 28, the interface termination region 40, and the silicon carbide layer 10. FIG. 4 illustrates concentration distributions of nitrogen and carbon.

The concentration distribution of nitrogen has a peak in the interface termination region 40. The peak nitrogen concentration is, for example, $1\times10^{22}$ cm$^{-3}$ or more. The full width at half maximum for the peak of the concentration distribution of nitrogen is, for example, 1 nm or less. Nitrogen segregates at the interface between the silicon carbide layer 10 and the gate insulating layer 28.

The concentration of nitrogen at the first position X 1 nm away from the peak of the concentration distribution of nitrogen toward the gate insulating layer 28 is $1\times10^{18}$ cm$^{-3}$ or less. The concentration of nitrogen at the second position Y 1 nm away from the peak of the concentration distribution of nitrogen toward the silicon carbide layer 10 is $1\times10^{18}$ cm$^{-3}$ or less.

The concentration distribution of carbon decreases from the interface termination region 40 toward the gate insulating layer 28. The concentration of carbon at the first position X is $1\times10^{18}$ cm$^{-3}$ or less.

The gate electrode 30 is provided on the gate insulating layer 28. The gate electrode 30 interposes the gate insulating layer 28 with the silicon carbide layer 10. The gate insulating layer 28 is provided between the gate electrode 30 and the silicon carbide layer 10. The gate electrode 30 interposes the gate insulating layer 28 with the drift region 14. The gate insulating layer 28 is provided between the gate electrode 30 and the drift region 14. The gate electrode 30 interposes the gate insulating layer 28 with the p-well region 16. The gate insulating layer 28 is provided between the gate electrode 30 and the p-well region 16.

The gate electrode 30 is, for example, polycrystalline silicon containing n-type impurities or p-type impurities.

The interlayer insulating film 32 is formed on the gate electrode 30. The interlayer insulating film 32 is, for example, a silicon oxide film.

The source electrode 34 is electrically connected to the source region 18 and the p-well contact region 20. The source electrode 34 also functions as a p-well electrode that applies an electric potential to the p-well region 16.

The source electrode 34 is formed by, for example, stacking a barrier metal layer of nickel (Ni) and a metal layer of aluminum on the barrier metal layer. The barrier metal layer of nickel and the silicon carbide layer may react to form nickel silicide (NiSi, Ni$_2$Si, or the like). The barrier metal layer of nickel and the metal layer of aluminum may form an alloy by reaction.

The drain electrode 36 is provided on the side of the silicon carbide layer 10 opposite to the source electrode 34, that is, on the back surface side. The drain electrode 36 is, for example, nickel. Nickel may react with the drain region 12 to form nickel silicide (NiSi, Ni$_2$Si, or the like).

In the first embodiment, the n-type impurities are, for example, nitrogen or phosphorus. Arsenic (As) or antimony (Sb) can also be applied as the n-type impurities.

In the first embodiment, the p-type impurities are, for example, aluminum. Boron (B), gallium (Ga), and indium (In) can also be applied as the p-type impurities.

Next, an example of a method for manufacturing the semiconductor device according to the first embodiment will be described.

In the method for manufacturing a semiconductor device according to the first embodiment, a silicon oxide film having an atomic ratio of oxygen (O) to silicon (Si) of less than 2 is formed on a surface of a silicon carbide layer by a vapor phase growth method, a first heat treatment is performed at a temperature of 350° C. or less and a pressure of 5 MPa or more in an atmosphere containing nitrogen oxide after the silicon oxide film is formed, and a second heat treatment is performed at a temperature of 900° C. or more in a non-oxidizing atmosphere after the first heat treatment.

Figure 5:
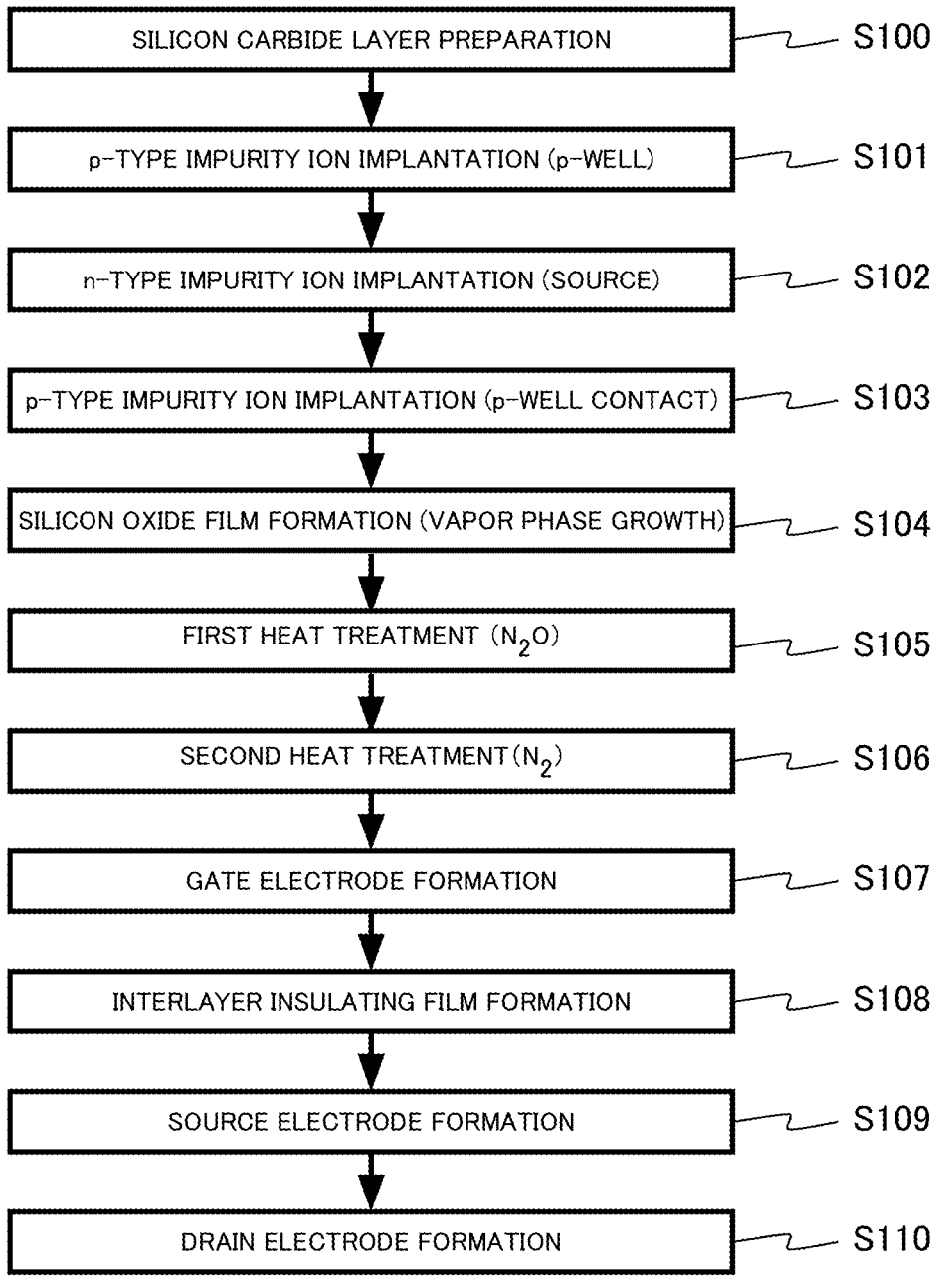
FIG. 5 is a process flow diagram of a method for manufacturing the semiconductor device according to the first embodiment.

FIG. 5 is a process flow diagram of the method for manufacturing the semiconductor device according to the first embodiment.

As illustrated in FIG. 5, the method for manufacturing the semiconductor device according to the first embodiment includes silicon carbide layer preparation (step S100), p-type impurity ion implantation (step S101), n-type impurity ion implantation (step S102), p-type impurity ion implantation (step S103), silicon oxide film formation (step S104), first heat treatment (step S105), second heat treatment (step S106), gate electrode formation (step S107), interlayer insulating film formation (step S108), source electrode formation (step S109), and drain electrode formation (step S110).

In step S100, the silicon carbide layer 10 is prepared. The silicon carbide layer 10 includes an n$^+$-type drain region 12 and an n$^-$-type drift region 14. The drift region 14 is formed on the drain region 12 by, for example, an epitaxial growth method.

The drain region 12 contains nitrogen as n-type impurities. The n-type impurity concentration of the drain region 12 is, for example, $1\times10^{18}$ cm$^{-3}$ or more and $1\times10^{21}$ cm$^{-3}$ or less.

The drift region 14 contains nitrogen as n-type impurities. The n-type impurity concentration of the drift region 14 is, for example, $1\times10^{15}$ cm$^{-3}$ or more and $2\times10^{16}$ cm$^{-3}$ or less. The thickness of the drift region 14 is, for example, 5 μm or more and 100 μm or less.

In step S101, first, a first mask material is formed by patterning by photolithography and etching. Then, aluminum as p-type impurities is ion-implanted into the drift region 14 using the first mask material as an ion implantation mask. The p-well region 16 is formed by ion implantation.

In step S102, first, a second mask material is formed by patterning by photolithography and etching. Then, using the second mask material as an ion implantation mask, phosphorus as n-type impurities is ion-implanted into the drift region 14 to form the source region 18.

In step S103, a third mask material is formed by patterning by photolithography and etching. Using the third mask material as an ion implantation mask, aluminum as p-type impurities is ion-implanted into the drift region 14 to form the p-well contact region 20.

In step S104, a silicon oxide film is formed on the silicon carbide layer 10. The silicon oxide film finally becomes the gate insulating layer 28.

The silicon oxide film is formed by vapor phase growth. The silicon oxide film is formed by, for example, a chemical vapor deposition method (CVD method) or a physical vapor deposition method (PVD method). The silicon oxide film is a deposited film. The thickness of the silicon oxide film is, for example, 30 nm or more and 100 nm or less.

In the silicon oxide film formed in step S104, the atomic ratio (O/Si) of oxygen (O) to silicon (Si) is less than 2. The silicon oxide film formed in step S104 has a chemical composition that does not satisfy the stoichiometric ratio of silicon dioxide. The silicon oxide film formed in step S104 is a film deficient in oxygen (O).

In other words, the silicon oxide film formed in step S104 is a film in which silicon (Si) in the film is excessive. In other words, the silicon oxide film formed in step S104 is a silicon-rich silicon oxide film.

When the chemical composition of the silicon oxide film formed in step S104 is described as $SiO_{2-\delta}$, for example, $0.002 \leq \delta \leq 0.1$ is satisfied. That is, in the silicon oxide film, for example, the atomic ratio of oxygen (O) to silicon (Si) is 1.900 or more and 1.998 or less. That is, the silicon oxide film has, for example, an oxygen deficiency ratio of 0.1% or more and 5% or less.

The oxygen deficiency amount of the silicon oxide film formed in step S104 can be increased, for example, by reducing the oxygen partial pressure in the atmosphere of vapor phase growth. The oxygen partial pressure in the atmosphere when the silicon oxide film is formed in step S104 is, for example, 10% or less.

The temperature at which the silicon oxide film is formed in step S104 is, for example, 350° C. or less. By forming the silicon oxide film at a temperature of 350° C. or less, oxidation of the surface of the silicon carbide layer 10 can be suppressed.

In step S105, the first heat treatment is performed. The first heat treatment is performed at a temperature of 350° C. or less and a pressure of 5 MPa or more in an atmosphere containing nitrogen oxide (NOx).

The first heat treatment is a heat treatment at a low temperature and a high pressure. The first heat treatment is performed, for example, in a supercritical fluid. The first heat treatment is performed, for example, under a condition that nitrogen oxide becomes a supercritical fluid.

The nitrogen oxide used in the first heat treatment is, for example, dinitrogen oxide ($N_2O$) or nitrogen monoxide (NO).

Dinitrogen oxide ($N_2O$) becomes a supercritical fluid under the condition of, for example, 36.3° C. or more and 7.24 MPa or more.

The temperature of the first heat treatment is, for example, 30° C. or more and 350° C. or less. The pressure of the first heat treatment is, for example, 5 MPa or more and 200 MPa or less.

The interface termination region 40 is formed at the interface between the silicon carbide layer 10 and the gate insulating layer 28 by the first heat treatment.

In step S106, the second heat treatment is performed. The second heat treatment is performed at 900° C. or more in a non-oxidizing atmosphere. The second heat treatment is performed in a non-oxidizing atmosphere in which the surface of the silicon carbide layer 10 is not oxidized.

The second heat treatment is performed, for example, in an atmosphere containing an inert gas. The second heat treatment is performed, for example, in an atmosphere containing argon (Ar) or nitrogen (N). The second heat treatment is performed, for example, in an atmosphere containing argon gas or nitrogen gas.

The oxygen partial pressure in the second heat treatment is, for example, 100 ppm or less.

The temperature of the second heat treatment is higher than the temperature of the first heat treatment. The temperature of the second heat treatment is, for example, 900° C. or more and 1250° C. or less.

The second heat treatment functions as densify annealing of the silicon oxide film. By the second heat treatment, the silicon oxide film becomes a high-density film.

In step S107, the gate electrode 30 is formed on the gate insulating layer 28. The gate electrode 30 is, for example, polycrystalline silicon containing n-type impurities or p-type impurities.

In step S108, the interlayer insulating film 32 is formed on the gate electrode 30. The interlayer insulating film 32 is, for example, a silicon oxide film.

In step S109, the source electrode 34 is formed. The source electrode 34 is formed on the source region 18 and the p-well contact region 20. The source electrode 34 is formed by sputtering of nickel (Ni) and aluminum (Al), for example.

In step S110, the drain electrode 36 is formed. The drain electrode 36 is formed on the back surface side of the silicon carbide layer 10. The drain electrode 36 is formed by, for example, sputtering of nickel.

The MOSFET 100 illustrated in FIG. 1 is formed by the above manufacturing method.

Next, functions and effects of the semiconductor device and the method for manufacturing the semiconductor device according to the first embodiment will be described.

When the MOSFET is formed using silicon carbide, there is a problem that carrier mobility decreases. One factor that decreases the carrier mobility is considered to be an interface state (intersurface state) between the silicon carbide layer and the gate insulating layer. The interface state is considered to be generated by a dangling bond present on the surface of the silicon carbide layer.

The MOSFET 100 of the first embodiment includes the interface termination region 40 in which nitrogen is segregated between the silicon carbide layer 10 and the gate insulating layer 28. The dangling bond is terminated by nitrogen contained in the interface termination region 40, and the dangling bond present on the surface of the silicon carbide layer is reduced. Therefore, a MOSFET in which carrier mobility is improved is realized.

The concentration of nitrogen in the interface termination region 40 is $1 \times 10^{21}$ cm$^{-3}$ or more. From the viewpoint of suppressing a decrease in carrier mobility of the MOSFET 100, the nitrogen concentration at the peak of the interface termination region 40 of the concentration distribution of nitrogen is preferably $1 \times 10^{22}$ cm$^{-3}$ or more, and more preferably $5 \times 10^{22}$ cm$^{-3}$ or more.

Another factor that decreases the carrier mobility of the MOSFET is considered to be stress generated in the vicinity of the interface between the silicon carbide layer and the gate insulating layer. For example, it is conceivable that a lattice of a surface of the silicon carbide layer is distorted or a defect is generated by stress generated in the vicinity of the interface, so that carrier mobility of the MOSFET is reduced.

In the MOSFET 100 according to the first embodiment, as illustrated in FIG. 3, the peak frequency of the longitudinal wave optical mode at a position 0.5 nm away from the silicon carbide layer in the gate insulating layer 28 is 1245 cm$^{-1}$ or more. The peak frequency of the longitudinal wave optical mode at an arbitrary position of the gate insulating layer 28 away from the silicon carbide layer by 0.5 nm or more is 1245 cm$^{-1}$ or more.

The gate insulating layer 28 of the MOSFET 100 of the first embodiment is silicon oxide. The peak frequency of the longitudinal wave optical mode of silicon oxide is an index of the magnitude of distortion of silicon oxide. When the distortion of the silicon oxide is large, the peak frequency of the longitudinal wave optical mode of the silicon oxide decreases.

In a state where there is no distortion in silicon oxide, the peak frequency of the longitudinal wave optical mode is 1255 cm$^{-1}$.

The peak frequency of the longitudinal wave optical mode of silicon oxide in the gate insulating layer 28 of the MOSFET 100 of the first embodiment does not decrease to the vicinity of the interface of the silicon carbide layer 10. Therefore, the silicon oxide in the gate insulating layer 28 of the MOSFET 100 is in a state where the distortion is small up to the vicinity of the interface of the silicon carbide layer 10.

Therefore, distortion of the lattice on the surface of the silicon carbide layer 10 and generation of defects due to distortion in the gate insulating layer 28 are suppressed. Therefore, the carrier mobility of the MOSFET 100 is improved.

The MOSFET 100 of the first embodiment is manufactured by the method for manufacturing the semiconductor device of the first embodiment, so that particularly the distortion in the gate insulating layer 28 in the vicinity of the interface of the silicon carbide layer 10 is reduced.

That is, the formation of the silicon-rich silicon oxide film, the first heat treatment at a low temperature and a high pressure in the atmosphere containing nitrogen oxide, and the second heat treatment in the non-oxidizing atmosphere at a higher temperature than the first heat treatment are performed, so that the distortion in the gate insulating layer 28 in the vicinity of the interface of the silicon carbide layer 10 is reduced.

FIG. 6 is a process flow diagram of the method for manufacturing the semiconductor device of the comparative example. The method for manufacturing the semiconductor device according to the comparative example is different from the method for manufacturing the semiconductor device according to the first embodiment in that a heat treatment (step S905) performed in a high-temperature atmosphere containing nitrogen oxide (NOx) is performed instead of the first heat treatment (step S105) at a low temperature and a high pressure in an atmosphere containing nitrogen oxide and the second heat treatment (step S106) in a non-oxidizing atmosphere at a higher temperature than the first heat treatment. Furthermore, the method for manufacturing the semiconductor device according to the comparative embodiment is different from the method for manufacturing the semiconductor device according to the first embodiment in that a silicon oxide film satisfying the stoichiometric ratio of silicon dioxide is formed in the silicon oxide film formation (step S104).

In step S905, heat treatment is performed. The heat treatment is performed in an atmosphere containing nitrogen oxide (NOx). The nitrogen oxide is, for example, nitrogen monoxide (NO) or dinitrogen monoxide (N$_2$O).

The temperature of the heat treatment in step S905 is, for example, 1100° C. or more and 1450° C. or less. The temperature of the heat treatment in step S905 is higher than the temperature of the first heat treatment (step S105) in the method for manufacturing the semiconductor device according to the first embodiment.

By the heat treatment in step S905, the interface termination region is formed at the interface between the silicon carbide layer and the silicon oxide film.

Figure 7:
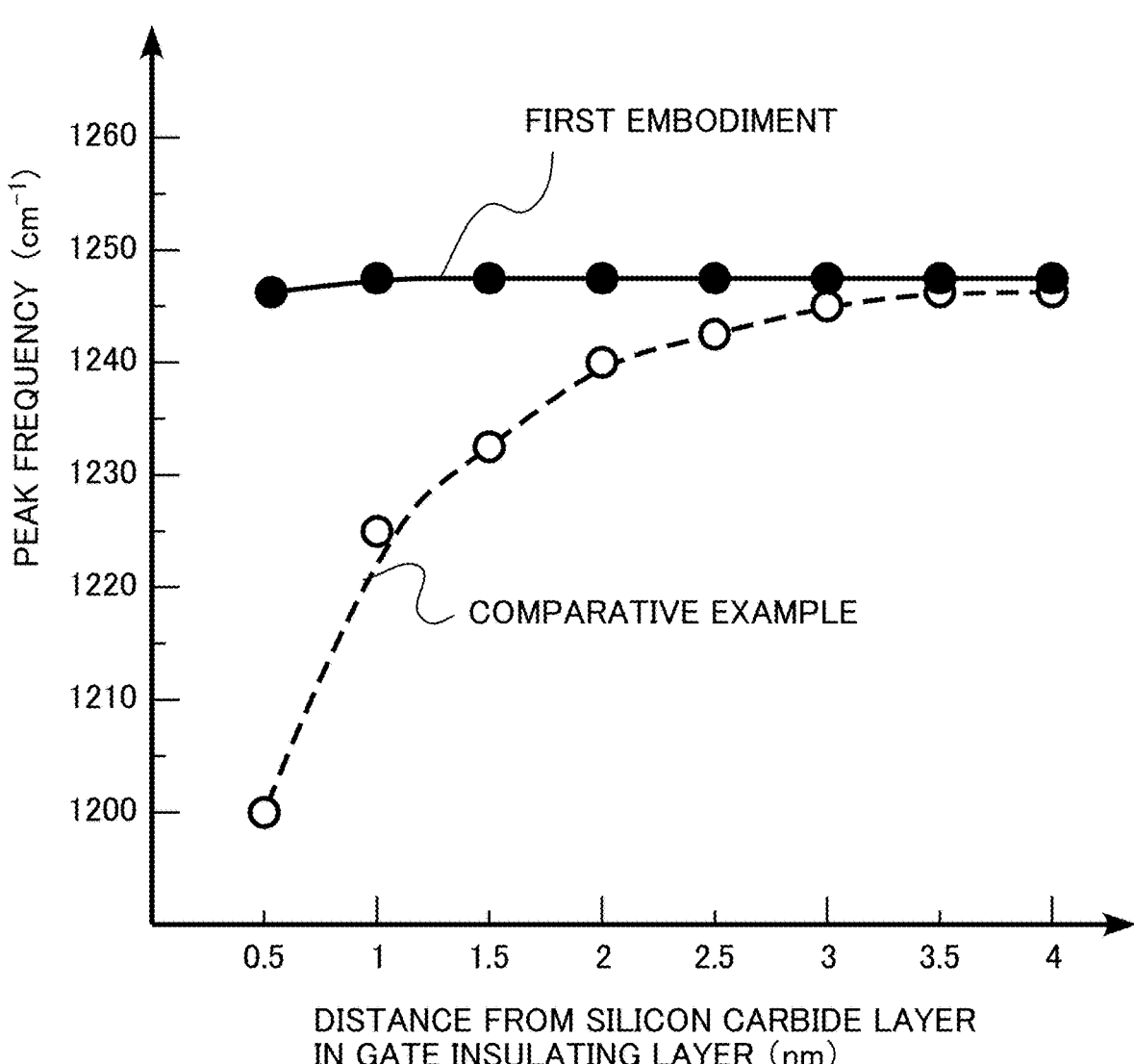
FIG. 7 is a diagram illustrating a peak frequency of a longitudinal wave optical mode in a gate insulating layer of the semiconductor device according to the comparative example.

FIG. 7 is a diagram illustrating a peak frequency of a longitudinal wave optical mode in a gate insulating layer of the semiconductor device according to the comparative example. The semiconductor device of the comparative example is a MOSFET manufactured by the manufacturing method illustrated in FIG. 6. FIG. 7 is a diagram corresponding to FIG. 3 of the first embodiment. FIG. 7 also illustrates a peak frequency of the longitudinal wave optical mode in the gate insulating layer of the semiconductor device of the first embodiment for comparison.

As illustrated in FIG. 7, the peak frequency of the longitudinal wave optical mode decreases in a region close to the silicon carbide layer of the gate insulating layer of the comparative example. For example, the peak frequency of the longitudinal wave optical mode at a position 0.5 nm away from the silicon carbide layer is about 1200 cm$^{-1}$.

As illustrated in FIG. 7, in the MOSFET of the comparative example, the peak frequency of the longitudinal wave optical mode in the region close to the silicon carbide layer of the gate insulating layer is low. That is, silicon oxide in the gate insulating layer of the MOSFET of the comparative example has large distortion near the interface of the silicon carbide layer.

Therefore, in the MOSFET of the comparative example, the lattice of the surface of the silicon carbide layer is distorted or defects occur due to distortion in the gate insulating layer. Therefore, the carrier mobility of the MOSFET of the comparative example decreases.

Figure 8:
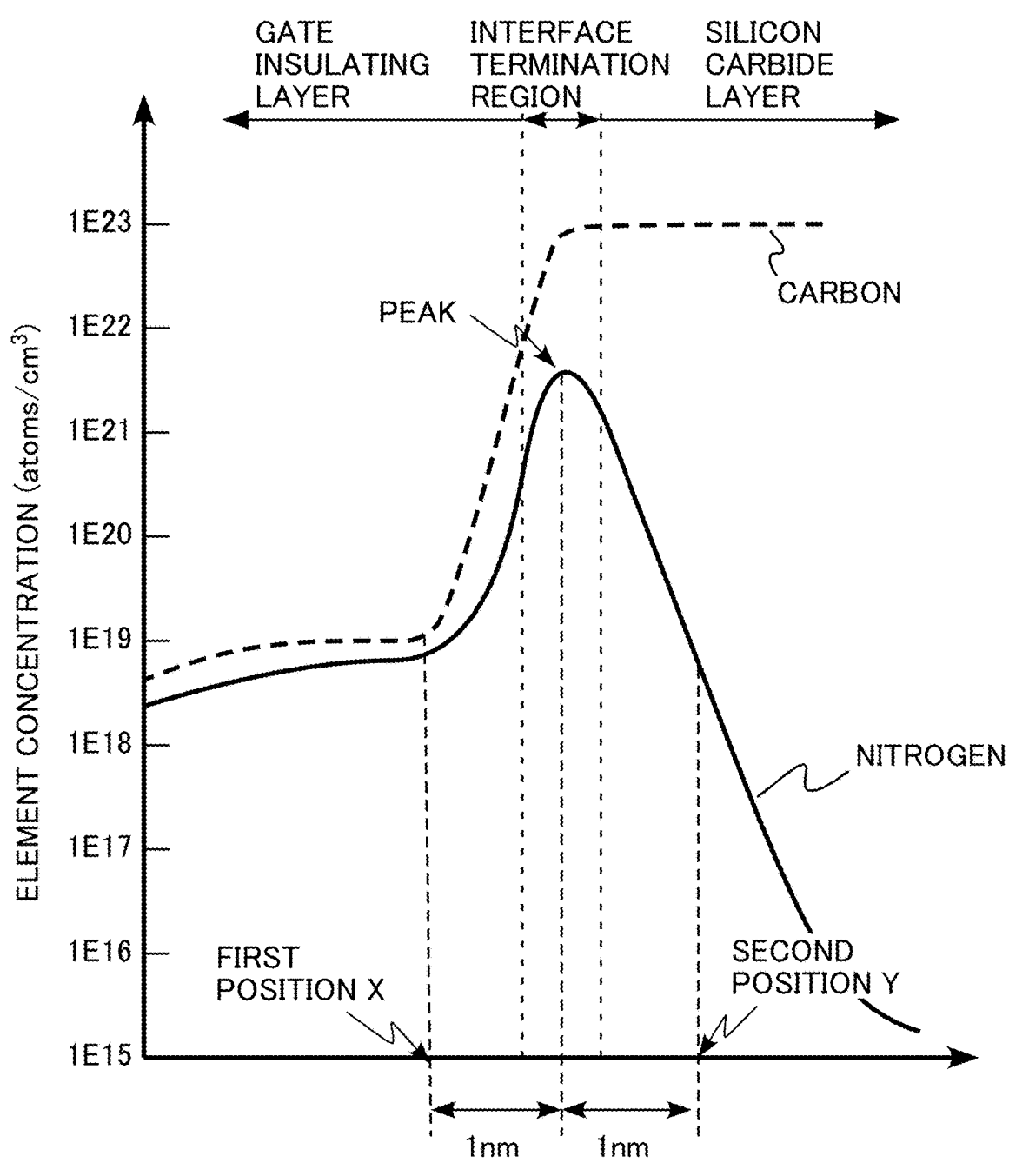
FIG. 8 is a diagram illustrating an element concentration distribution of the semiconductor device according to the comparative example.

FIG. 8 is a diagram illustrating an element concentration distribution of the semiconductor device of the comparative example. The semiconductor device of the comparative example is a MOSFET manufactured by the manufacturing method illustrated in FIG. 6.

FIG. 8 is a diagram illustrating an element concentration distribution in the gate insulating layer, the interface termination region, and the silicon carbide layer. FIG. 8 illustrates concentration distributions of nitrogen and carbon. FIG. 8 is a diagram corresponding to FIG. 4 of the first embodiment.

The concentration distribution of nitrogen has a peak in the interface termination region. The peak nitrogen concentration is, for example, 1×10$^{21}$ cm$^{-3}$ or more and less than 1×10$^{22}$ cm$^{-3}$. The peak nitrogen concentration is lower than that of the MOSFET 100 of the first embodiment. In the case of the MOSFET of the comparative example, since the concentration of nitrogen at the interface termination is low, there is a possibility that the dangling bond on the surface of the silicon carbide layer cannot be sufficiently terminated.

In the high temperature treatment (step S905) in the nitrogen oxide atmosphere of the comparative example, oxidation and nitriding of the substrate surface occur simultaneously. Since the interface moves to the substrate side by oxidation, there is an upper limit on the amount of nitriding, and it is considered that the concentration of nitrogen in the interface termination region does not increase. In the MOSFET of the comparative example, the interface state may remain, leading to a decrease in mobility.

The concentration of nitrogen at a first position X 1 nm away from the peak of the concentration distribution of nitrogen of the MOSFET of the comparative example toward the gate insulating layer is higher than 1×10$^{18}$ cm$^{-3}$.

That is, the concentration of nitrogen at the first position X is higher than that of the MOSFET 100 of the first embodiment.

The carbon concentration distribution in the MOSFET of the comparative example decreases from the interface termination region 40 toward the gate insulating layer 28. The concentration of carbon at the first position X is higher than $1 \times 10^{18}$ cm$^{-3}$. That is, the concentration of carbon at the first position X is higher than that of the MOSFET 100 of the first embodiment.

In the MOSFET of the comparative example, the concentration of carbon and nitrogen in the gate insulating layer is higher than that of the MOSFET 100 of the first embodiment. It is considered that carbon and nitrogen in the gate insulating layer form defects in the gate insulating layer.

Figure 9:
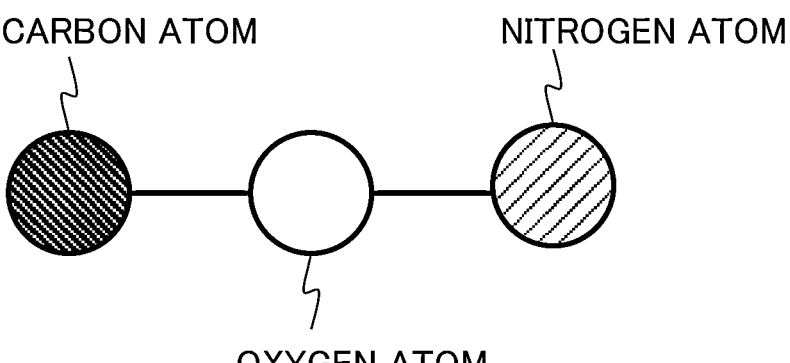
FIG. 9 is an explanatory diagram of defects in the gate insulating layer according to the comparative example.

FIG. 9 is an explanatory diagram of defects in the gate insulating layer of the comparative example. FIG. 9 illustrates a complex containing a carbon atom bonded to an oxygen atom and a nitrogen atom bonded to the oxygen atom. FIG. 9 illustrates a C—O—N bond. A carbon atom and a nitrogen atom in the C—O—N bond enter a silicon site of silicon oxide. It is considered that carbon and nitrogen in the gate insulating layer of the MOSFET of the comparative example form, for example, a defect having a C—O—N bond (hereinafter, referred to as a C—O—N defect).

It is considered that carbon in the gate insulating layer of the comparative example is derived from carbon released from the silicon carbide layer when the surface of the silicon carbide layer is oxidized. In addition, it is considered that nitrogen of the nitrogen oxide in the atmosphere of the heat treatment in step S905 is bonded to carbon released from the silicon carbide layer to form a C—O—N defect, thereby remaining in the gate insulating layer.

As illustrated in FIG. 7, the reason why the distortion in the vicinity of the interface of the silicon carbide layer of the gate insulating layer of the MOSFET of the comparative example increases is considered to be because a large number of C—O—N defects are formed in the vicinity of the interface of the silicon carbide layer of the gate insulating layer.

A carbon atom and a nitrogen atom of the C—O—N defect in the silicon oxide film enter a silicon site of silicon oxide. The C—O—N defects in the silicon oxide film can be removed by the presence of a sufficient amount of silicon atoms and a sufficient amount of nitrogen oxide in the silicon oxide film.

That is, when a sufficient amount of silicon atoms and a sufficient amount of nitrogen oxide are present in the silicon oxide film, the carbon atoms of the C—O—N defects are separated from the silicon sites as CO gas, and the silicon atoms fill the silicon sites. In addition, when a sufficient amount of silicon atoms and a sufficient amount of nitrogen oxide are present in the silicon oxide film, the nitrogen atoms of the C—O—N defects are separated from the silicon sites as nitrogen gas (N$_2$), and the silicon atoms fill the silicon sites.

The reaction in which the C—O—N defects are removed from the silicon oxide film is a reaction in which the system is more stabilized in terms of energy.

However, for example, when nitrogen oxide is to be supplied in a high-temperature atmosphere as in step S905 of the method for manufacturing the MOSFET of the comparative example, carbon atoms are released from the silicon carbide layer when the surface of the silicon carbide layer is oxidized, and C—O—N defects are newly generated. Therefore, it is difficult to remove the C—O—N defects from the silicon oxide film.

In the method for manufacturing the semiconductor device according to the first embodiment, a silicon-rich silicon oxide film is formed in step S104 so that a sufficient amount of silicon atoms are present in the silicon oxide film. Furthermore, by the first heat treatment at a low temperature and a high pressure in the atmosphere containing nitrogen oxide in step S105, a sufficient amount of nitrogen oxide is made to exist in the silicon oxide film while suppressing oxidation of the surface of the silicon carbide layer 10. The first heat treatment can supply a sufficient amount of nitrogen oxide into the silicon oxide film by increasing the pressure even at a low temperature. Since the temperature is low, unstable defects at the SiO$_2$/SiC interface can be repaired without proceeding with substrate oxidation. As a result, an interface nitrogen termination structure containing a sufficient amount of nitrogen is realized.

In the MOSFET 100 of the first embodiment, the C—O—N defects can be removed from the silicon oxide film by formation of the silicon-rich silicon oxide film and the first heat treatment.

Furthermore, by performing the second heat treatment in a non-oxidizing atmosphere at a higher temperature than the first heat treatment, the silicon oxide film from which the C—O—N defects have been removed is densified. As a result, the distortion is reduced, and the high-density gate insulating layer 28 of silicon oxide can be formed.

From the viewpoint of suppressing oxidation of the surface of the silicon carbide layer 10, the formation of the silicon oxide film is preferably performed at a temperature of 350° C. or less, and more preferably performed at a temperature of 300° C. or less.

From the viewpoint of ensuring that a sufficient amount of silicon atoms are present in the silicon oxide, the atomic ratio (O/Si) of oxygen (O) to silicon (Si) in the silicon oxide film to be formed is preferably 1.998 or less, and more preferably 1.990 or less.

The oxygen partial pressure in the atmosphere at the time of forming the silicon oxide film is preferably 10% or less, and more preferably 5% or less. By reducing the oxygen partial pressure in the atmosphere when the silicon oxide film is formed, the atomic ratio (O/Si) of oxygen (O) to silicon (Si) of the silicon oxide film to be formed can be reduced. In addition, it is possible to suppress oxidation of the surface of the silicon carbide layer 10 when the silicon oxide film is formed.

From the viewpoint of ensuring that a sufficient amount of nitrogen oxide is present in the silicon oxide film, the pressure of the first heat treatment is preferably 6 MPa or more, more preferably 7 MPa or more, and still more preferably 10 MPa or more. When the pressure is 200 MPa or less, annealing can be performed with a simple apparatus, and therefore the pressure is preferably 200 MPa or less.

From the viewpoint of ensuring that a sufficient amount of nitrogen oxide is present in the silicon oxide film, the first heat treatment is preferably performed in a supercritical fluid.

From the viewpoint of suppressing oxidation of the surface of the silicon carbide layer 10, the temperature of the first heat treatment is preferably 200° C. or less, and more preferably 100° C. or less. The nitrogen oxide is easily introduced into the silicon oxide under high pressure, so that the temperature can be lowered. Nevertheless, the temperature is preferably 30° C. or more, and more preferably 35° C. or more because nitrogen oxide is more easily introduced into silicon oxide at higher temperatures.

From the viewpoint of increasing the density of the silicon oxide film, the temperature of the second heat treatment is preferably 950° C. or more, and more preferably 1000° C. or more.

From the viewpoint of suppressing oxidation of the surface of the silicon carbide layer 10, the oxygen partial pressure in the atmosphere of the second heat treatment is preferably 100 ppm or less, preferably 50 ppm or less, and more preferably 10 ppm or less. The interface between the SiC substrate and the silicon oxide film is nitrogen-terminated by the first heat treatment. Therefore, the oxidation resistance of the SiC substrate is improved, and the substrate is not oxidized with a trace amount of oxygen. From the viewpoint of chamber protection, it is desirable that oxygen is present in an amount of 1 ppm or more.

The C—O—N defects in the gate insulating layer form a trap level. Therefore, the presence of the C—O—N defects in the gate insulating layer also causes problems that the threshold voltage fluctuates, the leakage current of the gate insulating layer increases, and the reliability of the gate insulating layer decreases due to the trap level.

In the MOSFET 100 of the first embodiment, the amount of C—O—N defects in the gate insulating layer 28 is reduced. Therefore, the fluctuation of the threshold voltage, the increase in the leakage current of the gate insulating layer, or the decrease in the reliability of the gate insulating layer caused by the C—O—N defects are suppressed.

As described above, according to the first embodiment, the semiconductor device and the method for manufacturing the semiconductor device in which the carrier mobility is improved by reducing the distortion of the gate insulating layer are realized.

Second Embodiment

A semiconductor device of a second embodiment is different from that of the first embodiment in that the semiconductor device is a trench gate type MOSFET including a gate electrode in a trench. Hereinafter, description of contents overlapping with the first embodiment will be partially omitted.

Figure 10:
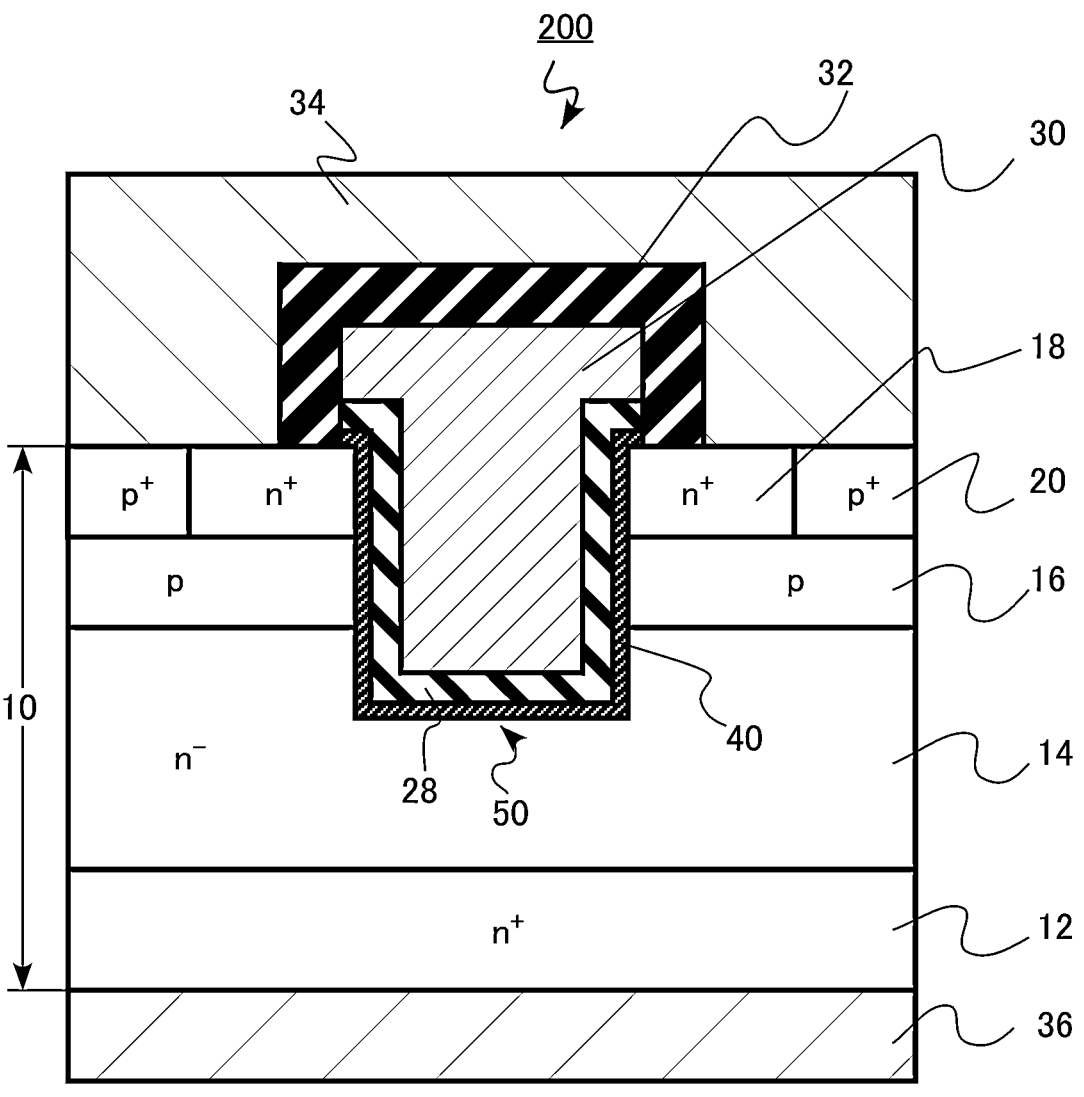
FIG. 10 is a schematic cross-sectional view of a semiconductor device according to a second embodiment.

FIG. 10 is a schematic cross-sectional view of the semiconductor device of the second embodiment. The semiconductor device of the second embodiment is a MOSFET 200. The MOSFET 200 is a trench gate type MOSFET including a gate electrode in a trench. The MOSFET 200 is an n-channel MOSFET using electrons as carriers.

The MOSFET 200 includes a silicon carbide layer 10, a gate insulating layer 28 (silicon oxide layer), a gate electrode 30, an interlayer insulating film 32, a source electrode 34, a drain electrode 36, an interface termination region 40 (region), and a trench 50.

The silicon carbide layer 10 includes a drain region 12, a drift region 14, a p-well region 16, a source region 18, and a p-well contact region 20.

The trench 50 penetrates the source region 18 and the p-well region 16 and reaches the drift region 14. The bottom surface of the trench 50 is located in the drift region 14.

A gate insulating layer 28 and a gate electrode 30 are provided in the trench 50. The side surface of the trench 50 is, for example, a face having an off angle of 0 degrees or more and 8 degrees or less with respect to the m-face.

As described above, according to the second embodiment, the semiconductor device in which the carrier mobility is improved by reducing the distortion of the gate insulating layer can be realized. In addition, since it is a trench gate type, the channel density per unit area of the chip is increased, and the on-resistance of the MOSFET is reduced.

Third Embodiment

A semiconductor device of a third embodiment is different from that of the first embodiment in that a gate insulating layer is present in a termination region of a MOSFET. A part of the description overlapping with the first embodiment will be omitted.

Figure 11:
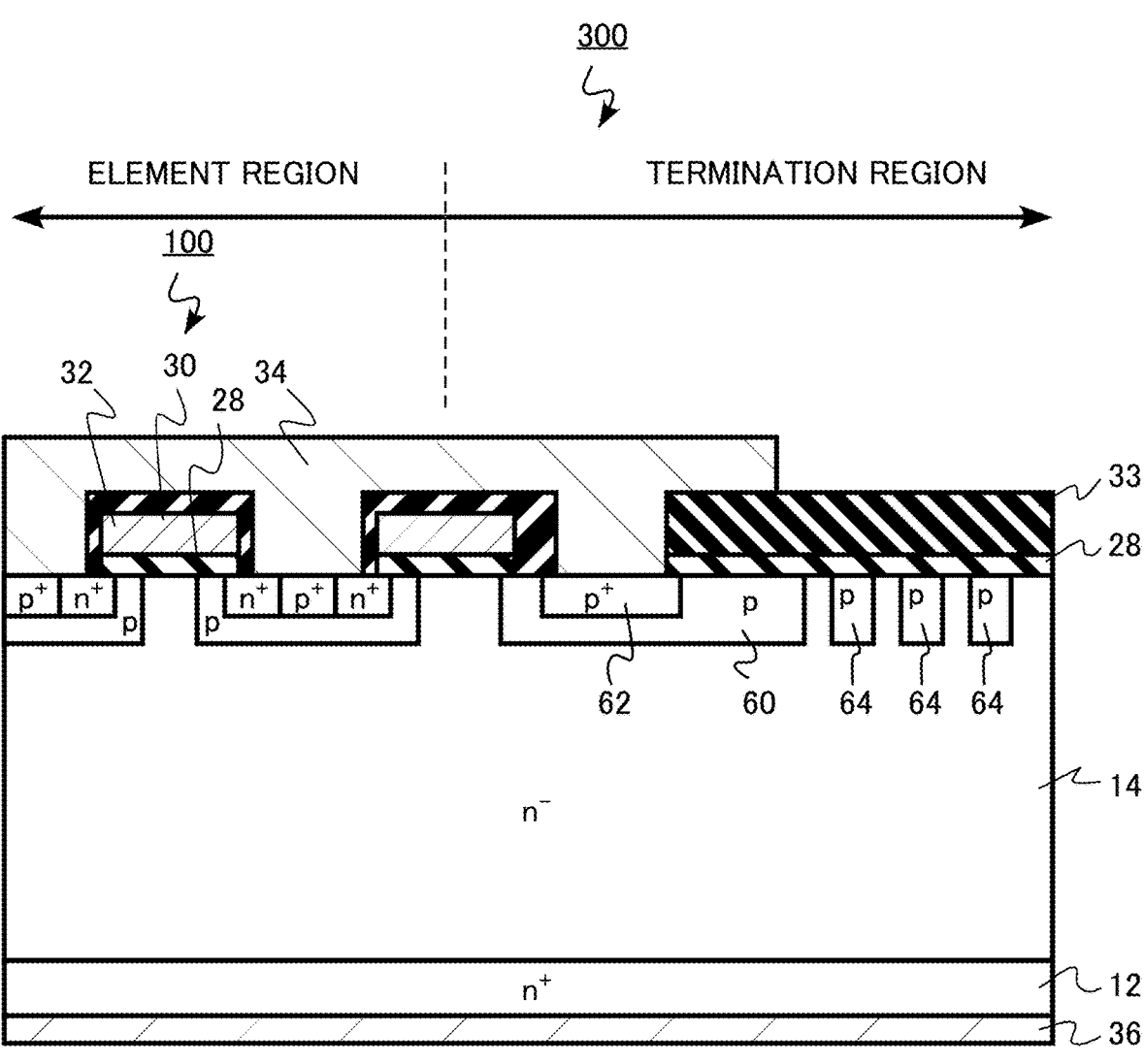
FIG. 11 is a schematic cross-sectional view of a semiconductor device according to a third embodiment.

FIG. 11 is a schematic cross-sectional view of the semiconductor device of the third embodiment. The semiconductor device of the third embodiment is a MOSFET 300. The MOSFET 300 includes an element region and a termination region provided around the element region. The termination region has a function of improving the breakdown voltage of the MOSFET 300.

In the element region, for example, the MOSFET 100 of the first embodiment is disposed as a unit cell.

The termination region includes a p-type RESURF region 60, a p$^+$-type contact region 62, a p-type guard ring region 64, a gate insulating layer 28 (silicon oxide layer), and a field oxide film 33.

The configuration of the gate insulating layer 28 is similar to that of the MOSFET 100 of the first embodiment.

The field oxide film 33 is, for example, a silicon oxide film.

An interface termination region containing nitrogen (not illustrated) is provided between the silicon carbide layer 10 and the gate insulating layer 28.

When the MOSFET 300 is turned off, a depletion layer is formed in the drift region 14 between the RESURF region 60, the guard ring region 64, and the guard ring region 64, so that the breakdown voltage of the MOSFET 300 is improved.

However, when the distortion of the gate insulating layer 28 is large, a defect due to the stress of the gate insulating layer 28 is formed on the surface of the RESURF region 60. When the defect is formed, for example, the defect may become n-type, and a desired depletion layer may not be formed. In this case, the breakdown voltage of the MOSFET 300 degrades.

According to the third embodiment, the distortion of the gate insulating layer 28 is reduced. Therefore, a desired depletion layer is formed in the termination region, and a MOSFET having a stable breakdown voltage is realized.

Fourth Embodiment

An inverter circuit and a drive device of a fourth embodiment are an inverter circuit and a drive device including the semiconductor device of the first embodiment.

Figure 12:
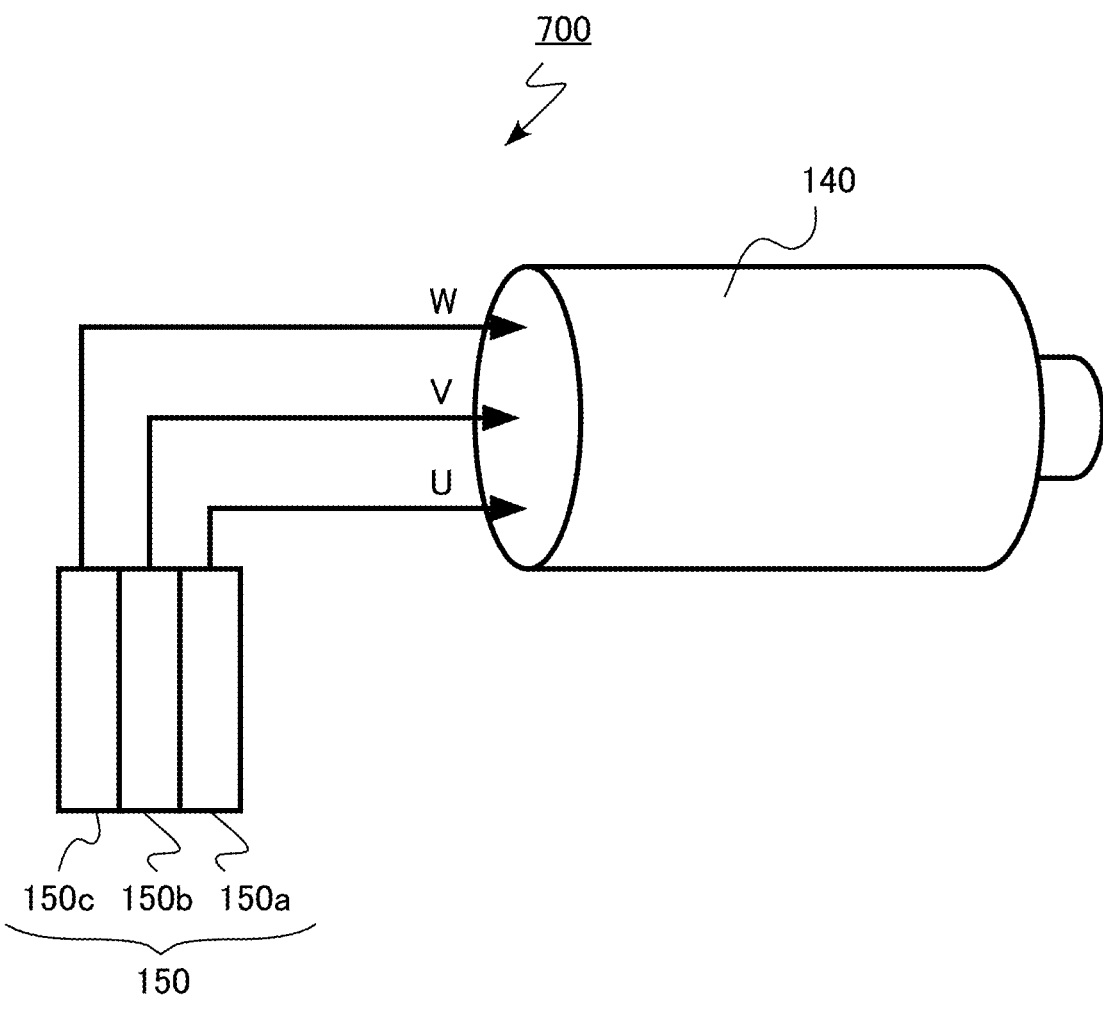
FIG. 12 is a schematic diagram of a drive device according to a fourth embodiment.

FIG. 12 is a schematic diagram of the drive device according to the fourth embodiment. The drive device 700 includes a motor 140 and an inverter circuit 150.

The inverter circuit 150 includes three semiconductor modules 150a, 150b, and 150c using the MOSFET 100 of the first embodiment as a switching element. By connecting the three semiconductor modules 150a, 150b, and 150c in parallel, a three-phase inverter circuit 150 including three AC voltage output terminals U, V, and W is realized. The motor 140 is driven by the AC voltage output from the inverter circuit 150.

According to the fourth embodiment, the characteristics of the inverter circuit 150 and the drive device 700 are improved by including the MOSFET 100 with improved characteristics.

Fifth Embodiment

A vehicle according to a fifth embodiment is a vehicle including the semiconductor device according to the first embodiment.

Figure 13:
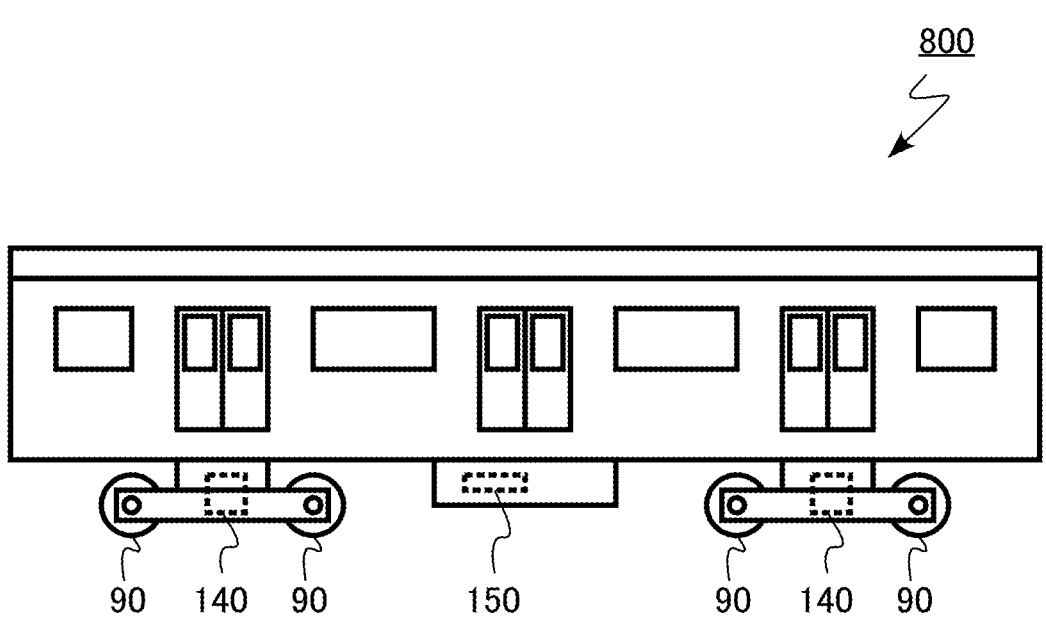
FIG. 13 is a schematic diagram of a vehicle according to a fifth embodiment.

FIG. 13 is a schematic diagram of the vehicle according to the fifth embodiment. A vehicle 800 of the fifth embodiment is a railway vehicle. The vehicle 800 includes a motor 140 and an inverter circuit 150.

The inverter circuit 150 includes three semiconductor modules using the MOSFET 100 of the first embodiment as a switching element. By connecting the three semiconductor modules in parallel, a three-phase inverter circuit 150 including three AC voltage output terminals U, V, and W is realized. The motor 140 is driven by the AC voltage output from the inverter circuit 150. Wheels 90 of the vehicle 800 are rotated by the motor 140.

According to the fifth embodiment, characteristics of the vehicle 800 are improved by providing the MOSFET 100 with improved characteristics.

Sixth Embodiment

A vehicle according to a sixth embodiment is a vehicle including the semiconductor device according to the first embodiment.

Figure 14:
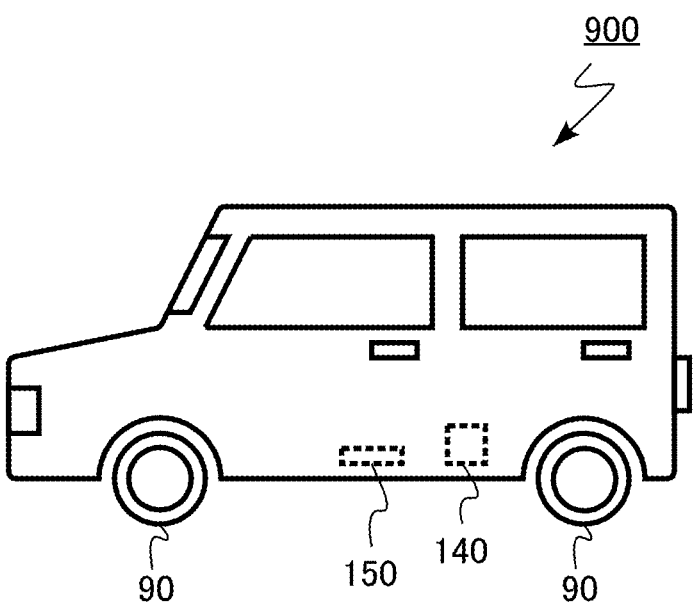
FIG. 14 is a schematic diagram of a vehicle according to a sixth embodiment.

FIG. 14 is a schematic diagram of the vehicle according to the sixth embodiment. A vehicle 900 of the sixth embodiment is an automobile. The vehicle 900 includes a motor 140 and an inverter circuit 150.

The inverter circuit 150 includes three semiconductor modules using the MOSFET 100 of the first embodiment as a switching element. By connecting the three semiconductor modules in parallel, a three-phase inverter circuit 150 including three AC voltage output terminals U, V, and W is realized.

The motor 140 is driven by the AC voltage output from the inverter circuit 150. Wheels 90 of the vehicle 900 are rotated by the motor 140.

According to the sixth embodiment, characteristics of the vehicle 900 are improved by providing the MOSFET 100 with improved characteristics.

Seventh Embodiment

An elevator according to a seventh embodiment is an elevator including the semiconductor device according to the first embodiment.

Figure 15:
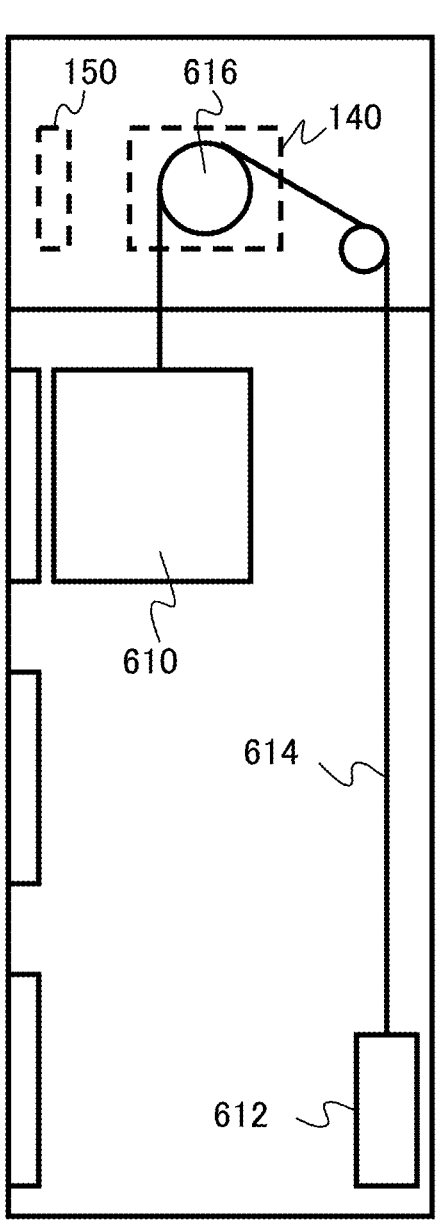
FIG. 15 is a schematic diagram of an elevator according to a seventh embodiment.

FIG. 15 is a schematic diagram of the elevator according to the seventh embodiment. An elevator 1000 of the seventh embodiment includes a car 610, a counterweight 612, a wire rope 614, a hoisting machine 616, a motor 140, and an inverter circuit 150.

The inverter circuit 150 includes three semiconductor modules using the MOSFET 100 of the first embodiment as a switching element. By connecting the three semiconductor modules in parallel, a three-phase inverter circuit 150 including three AC voltage output terminals U, V, and W is realized.

The motor 140 is driven by the AC voltage output from the inverter circuit 150. The hoisting machine 616 is rotated by the motor 140, and the car 610 moves up and down.

According to the seventh embodiment, the characteristics of the elevator 1000 are improved by providing the MOSFET 100 with improved characteristics.

As described above, in the first to third embodiments, the case of 4H-SiC has been described as an example of the crystal structure of silicon carbide, but the present disclosure can also be applied to silicon carbide having other crystal structures such as 6H-SiC and 3C-SiC.

In the first to third embodiments, the case where the gate insulating layer 28 is provided on the silicon face or the m-face of the silicon carbide layer has been described as an example, but the present disclosure can also be applied to a case where the gate insulating layer 28 is provided on other faces of silicon carbide, for example, a carbon face, an a-face, a (0-33-8) face, and the like.

The present disclosure can also be applied to an n-channel insulated gate bipolar transistor (IGBT).

Further, the present disclosure can be applied not only to the n-channel type but also to a p-channel type MOSFET or IGBT.

In the fourth to seventh embodiments, the case where the semiconductor device of the present disclosure is applied to a vehicle or an elevator has been described as an example, but the semiconductor device of the present disclosure can also be applied to, for example, a power conditioner of a solar power generation system.

Furthermore, in the fourth to seventh embodiments, the case where the semiconductor device of the first embodiment is applied has been described as an example, but for example, the semiconductor device of the second or third embodiment can also be applied.

While certain embodiments have been described, these embodiments have been presented by way of example only, and are not intended to limit the scope of the inventions. Indeed, a semiconductor device, a method for manufacturing a semiconductor device, an inverter circuit, a drive device, a vehicle, and an elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a silicon carbide layer;
a silicon oxide layer having a peak frequency of a longitudinal wave optical mode of 1245 cm$^{-1}$ or more at a position 0.5 nm away from the silicon carbide layer; and
a region located between the silicon carbide layer and the silicon oxide layer and having a nitrogen concentration of $1 \times 10^{21}$ cm$^{-3}$ or more,
wherein
a concentration distribution of nitrogen in the silicon carbide layer, the silicon oxide layer, and the region has a peak in the region, and
a concentration of nitrogen at a first position 1 nm away from the peak toward the silicon oxide layer is $1 \times 10^{18}$ cm$^{-3}$ or less, and a concentration of carbon at the first position is $1 \times 10^{18}$ cm$^{-3}$ or less.

2. A semiconductor device comprising:
a silicon carbide layer;
a silicon oxide layer having a peak frequency of a longitudinal wave optical mode of 1245 cm$^{-1}$ or more at a position 0.5 nm away from the silicon carbide layer; and
a region located between the silicon carbide layer and the silicon oxide layer and having a nitrogen concentration of $1 \times 10^{21}$ cm$^{-3}$ or more, wherein a concentration distribution of nitrogen in the silicon carbide layer, the silicon oxide layer, and the region has a peak in the region, and a concentration of nitrogen at a second position 1 nm away from the peak toward the silicon carbide layer is $1 \times 10^{18}$ cm$^{-3}$ or less.

3. The semiconductor device according to claim 1, wherein the peak has a nitrogen concentration of $1 \times 10^{22}$ cm$^{-3}$ or more.

4. The semiconductor device according to claim 1, further comprising a gate electrode interposing the silicon oxide layer with the silicon carbide layer.

5. An inverter circuit comprising the semiconductor device according to claim 1.

6. A drive device comprising the semiconductor device according to claim 1.

7. A vehicle comprising the semiconductor device according to claim 1.

8. An elevator comprising the semiconductor device according to claim 1.

9. The semiconductor device according to claim 2, wherein the peak has a nitrogen concentration of $1 \times 10^{22}$ cm$^{-3}$ or more.

10. The semiconductor device according to claim 2, further comprising a gate electrode interposing the silicon oxide layer with the silicon carbide layer.

11. An inverter circuit comprising the semiconductor device according to claim 2.

12. A drive device comprising the semiconductor device according to claim 2.

\* \* \* \* \*